United States Patent
Lin et al.

(10) Patent No.: US 8,847,227 B2
(45) Date of Patent: Sep. 30, 2014

(54) DISPLAY PANEL CIRCUIT STRUCTURE

(71) Applicant: E Ink Holdings Inc., Hsinchu (TW)

(72) Inventors: Po-Hsin Lin, Hsinchu (TW); Chi-Liang Wu, Hsinchu (TW); Chin-Wen Lin, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 14 days.

(21) Appl. No.: 13/684,249

(22) Filed: Nov. 23, 2012

(65) Prior Publication Data
US 2013/0200381 A1    Aug. 8, 2013

(30) Foreign Application Priority Data
Feb. 3, 2012   (TW) .............................. 101103541 A

(51) Int. Cl.
*H01L 29/10* (2006.01)
*G02F 1/1362* (2006.01)
*H01L 29/78* (2006.01)

(52) U.S. Cl.
CPC .......... *H01L 29/78* (2013.01); *G02F 1/136259* (2013.01); *G02F 2001/136263* (2013.01)
USPC ........................ 257/59; 257/88; 257/E51.108

(58) Field of Classification Search
CPC ..... H01L 29/78; H01L 27/32; H01L 27/3241; H01L 27/3281
USPC ................ 257/59, 72, 88, E51.022, E51.108, 257/E51.021, E33.001, E31.095
See application file for complete search history.

(56) References Cited

U.S. PATENT DOCUMENTS

| 5,086,347 | A | 2/1992 | Ukai et al. | |
| 7,829,895 | B2 | 11/2010 | Tsou | |
| 2004/0257487 | A1 | 12/2004 | Lee et al. | |
| 2005/0157220 | A1 | 7/2005 | Kim | |
| 2008/0182352 | A1* | 7/2008 | Cho et al. | 438/30 |
| 2008/0231583 | A1* | 9/2008 | Chen et al. | 345/98 |
| 2010/0127961 | A1* | 5/2010 | Huh et al. | 345/92 |
| 2010/0265424 | A1 | 10/2010 | Chiu et al. | |

FOREIGN PATENT DOCUMENTS

| TW | 200720803 A | 6/2007 |
| TW | 200730978 A | 8/2007 |

OTHER PUBLICATIONS

TW Office Action that these art references were cited.

* cited by examiner

*Primary Examiner* — Cuong Q Nguyen
*Assistant Examiner* — Yosef Gebreyesus
(74) *Attorney, Agent, or Firm* — CKC & Partners Co., Ltd.

(57) ABSTRACT

A display panel circuit structure includes a substrate, a first metal layer, a second metal layer, and a third metal layer. The first metal layer is disposed on the substrate. The second metal layer is disposed on the first metal layer and electrically connected to the first metal layer, in which the second metal layer has a pad area and a trace area connected to the pad area. The line width of the second metal layer in the pad area is greater than the line width of the second metal layer in the trace area. The third metal layer is disposed on the second metal layer, in which the third metal layer does not overlap the second metal layer n the trace area.

10 Claims, 4 Drawing Sheets

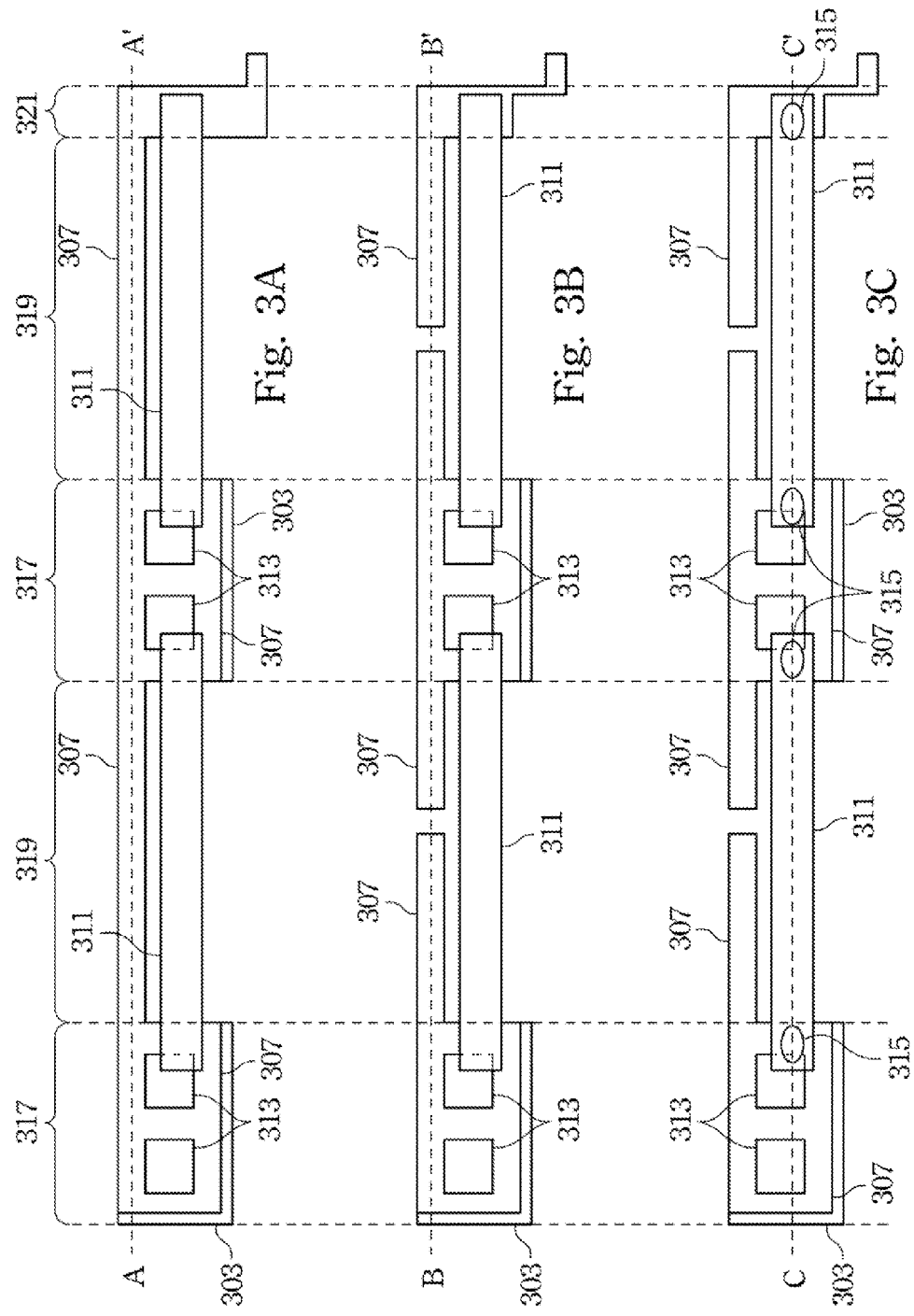

DISPLAY PANEL CIRCUIT STRUCTURE

RELATED APPLICATIONS

This application claims priority to Taiwan Application Serial Number 101103541, filed Feb. 3, 2012, which is herein incorporated by reference.

BACKGROUND

1. Technical Field Disclosure

The present disclosure relates to a display panel. More particularly, the present disclosure relates to a circuit structure of a display panel.

2. Description of Related Art

Digital logic circuits are generally serially connected to perform logic functions in conventional display devices disposed on substrates. However, metal layers of display devices are usually disconnected (opened) during manufacturing processes due to processes varieties, accidents, and other unpredictable events, and transistors as well as storage capacitors thereof cannot operate correctly if the disconnected metal layers are not repaired. As a result, serially connected logic circuits cannot perform the operation functions correctly, and the display devices cannot work normally, which severely affects the display quality. Also, the product yield is adversely affected so as to raise the manufacturer costs.

Therefore, there is a need for a new repairing method which can repair circuit failures to lower the ratio of defective products in a production line, so as to effectively reduce the manufacture costs.

SUMMARY

According to one embodiment of the present disclosure, a display panel circuit structure is disclosed. The display panel circuit structure includes a substrate, a first metal layer, and a second metal layer. The first metal layer is disposed on the substrate. The second metal layer is disposed on the first metal layer and is electrically connected to the first metal layer, in which the second metal layer has a pad area and a trace area connected to the pad area, and a line width of the second metal layer in the pad area is greater than a line width of the second metal layer in the trace area. The third metal layer is disposed on the second metal layer, in which the third metal layer does not overlap the second metal layer in the trace area.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 3A, FIG. 3B, and FIG. 3C show top views of the display panel circuit structure according to one embodiment of the present disclosure.

DETAILED DESCRIPTION

Figure 1:
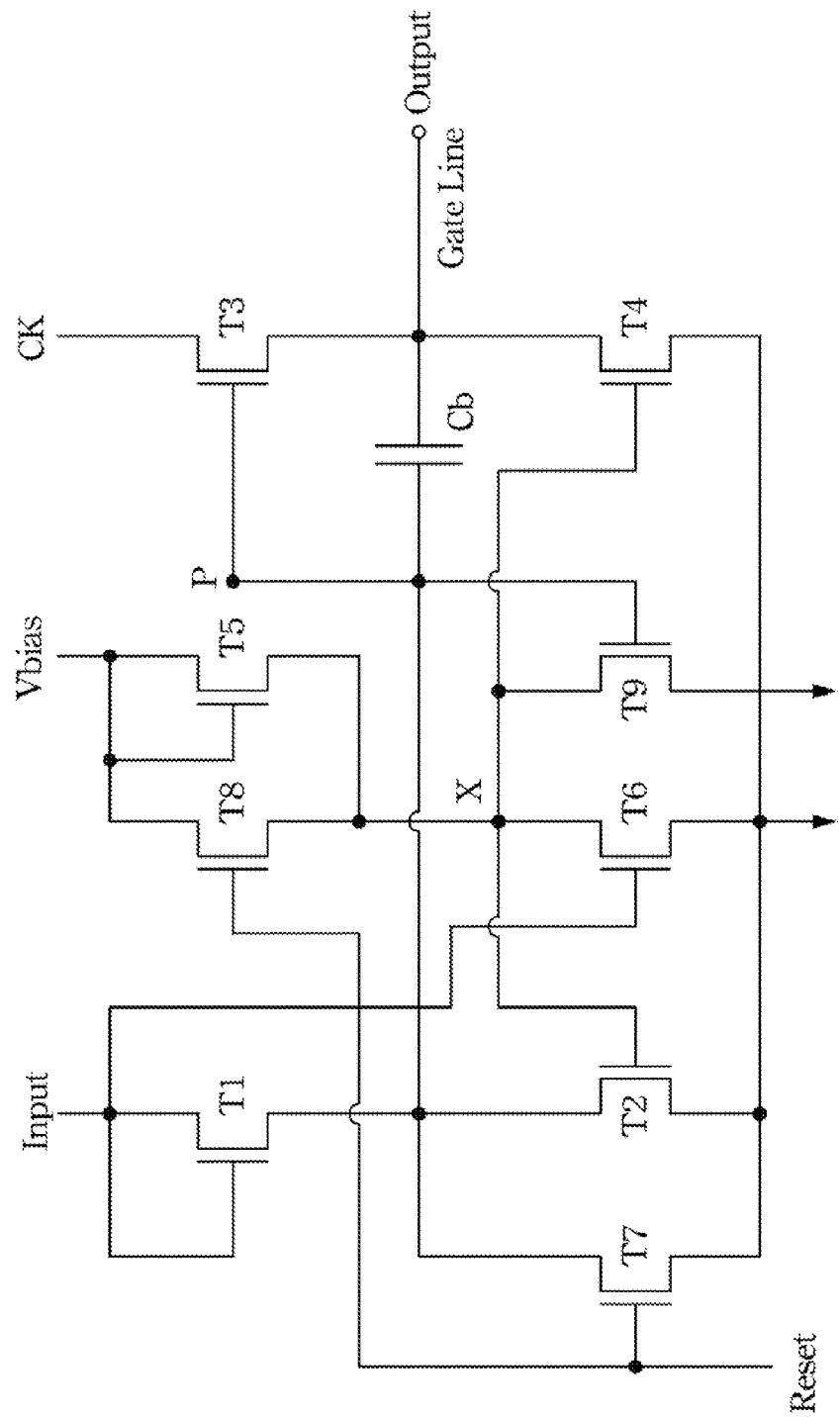
FIG. 1 is a circuit diagram of a digital logic circuit of a display panel according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The display panel circuit structure of the following embodiments has buried a metal layer for replacement in advance, and a broken metal layer can be replaced with the metal layer for replacement when circuit failure occurs, particularly the failure caused by the gate layer. Therefore, the display can operate correctly, product yield of the display can be improved, and costs for manufacturing the display can be reduced.

FIG. 1 is a circuit diagram of a digital logic circuit of a display panel according to one embodiment of the present disclosure. The digital logic circuit is substantially composed of nine transistors, T1 to T9, in which the transistor T1, the transistor T5, and the transistor T3 respectively receive an input signal Input, a bias signal $V_{bias}$, and a clock signal CK while transistor T7 and transistor T8 receive the reset signal Reset. The transistor T6 and the transistor T9 are responsible for pulling down voltage at node X. The digital logic circuit is serially connected to perform certain logic operations. In other words, signals are passed stage by stage to drive a display panel. Apparently, if any node in the digital logic circuit is broken and is open, the subsequent logic gates cannot operate correctly, and the display panel cannot be correctly driven. For example, if node X is open, the reset signal Reset cannot drive the terminal Output into a correct corresponding state, and the entire digital logic circuit cannot be correctly reset. Therefore, a replacement metal layer needs to be buried in advance in order to replace metal layer which is the broken such that the digital logic circuit can perform correctly.

Figure 2A:
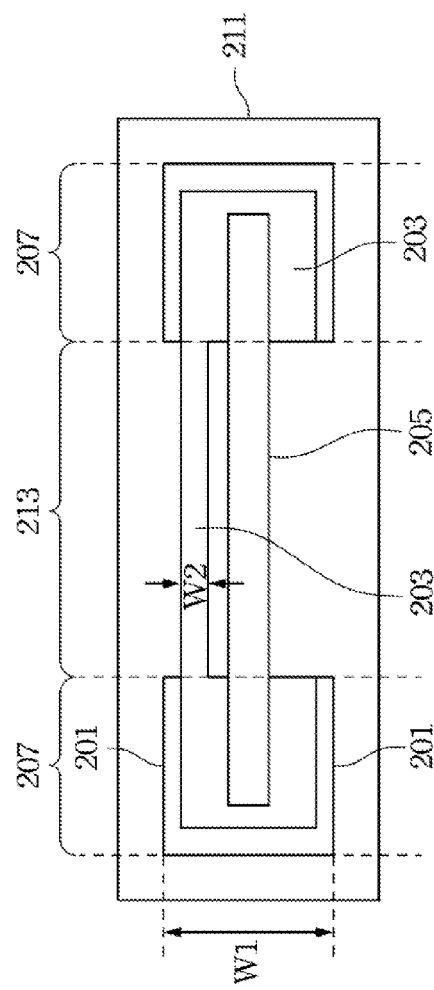
FIG. 2A and FIG. 2B show top views of a display panel circuit structure according to one embodiment of the present disclosure.
Figure 2B:
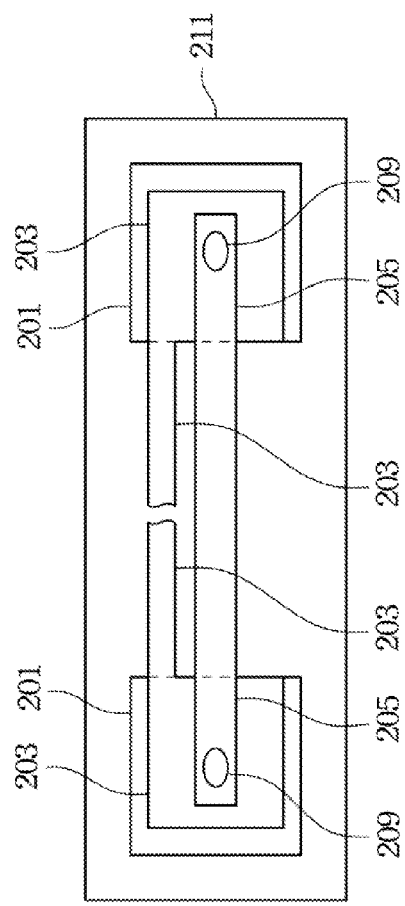

FIG. 2A and FIG. 2B show top views of a display panel circuit structure according to one embodiment of the present disclosure. The metal layers of FIG. 2A operate correctly and a certain metal layer of FIG. 2B is open and cannot conduct current. The display panel circuit structure substantially includes a substrate 211, a first metal layer 201, a second metal layer 203, and a third metal layer 205, in which the first metal layer 201, the second metal layer 203, and the third metal layer 205 are low-impedance conductive layers. The first metal layer 201 is a gate layer of a transistor, and the third metal layer 205 is buried into the display panel circuit structure in advance for replacing the open metal layer if any. The third metal layer 205 will not have function if the metal layers therein can work correctly and are not broken (open).

The first metal layer 201 is disposed on the substrate 211, the second metal layer 203 is disposed on the first metal layer 201, and the third metal layer 205 is disposed on the second metal layer 203, that is, the substrate 211, the first metal layer 201, the second metal layer 203, and the third metal layer 205 are sequentially piled up. The second metal layer 203 has a pad area 207 and a trace area 213 connected to the pad area 207, and a line width of the second metal layer 203 in the pad area 207 is greater than a line width of the second metal layer 203 in the trace area 213. Furthermore, the third metal layer 205 does not overlap the second metal layer 203 in the trace area 213

The third metal layer 205 is floating and is not contact with or not electrically connected to other metal layers when the second metal layer 203 is able to conduct current. On the other hand, if the second metal layer 203 is broken and is in a situation unable to conduct current (shown in FIG. 2B), the second metal layer 203 in the pad area 207 is welded to and electrically connected to the third metal layer 205 in the pad area 207 through a welding point 209 such that the second metal layer 203 is able to conduct current through the third metal layer 205. In more detail, the second metal layer 203 and the third metal layer 205 are electrically connected through laser welding.

FIG. 3A to FIG. 3F show top views of a display panel circuit structure according to one embodiment of the present disclosure.

The display panel circuit structure shown in FIG. 3A to FIG. 3C substantially includes a first metal layer 303, a second metal layer 307, and a third metal layer 311, in which the second metal layer 307 is disposed on the first metal layer 303, and the third metal layer 311 is disposed on the second metal layer 307. The second metal layer 307 is connected to the first metal layer 303 through a contact window 313, and a welding point 315 connects the second metal layer 307 to the third metal layer 311. The second metal layer 307 has a pad area 317 and a trace area 319 connected to the pad area 317, and a line width of the second metal layer 307 in the pad area 317 is greater than a line width of the second metal layer 307 in the trace area 319. Furthermore, the third metal layer 311 does not overlap the second metal layer 307 in the trace area 319.

In this embodiment, FIG. 3A shows the situation that the circuit structure of the display panel can operate correctly, which means the second metal layer 307 is not broken; FIG. 3B shows the situation that the second metal layer 307 is broken and is not able to conduct current while FIG. 3C shows the situation after repairing, in which the third metal layer 311 has been buried into the circuit structure in advance.

Figure 3D:
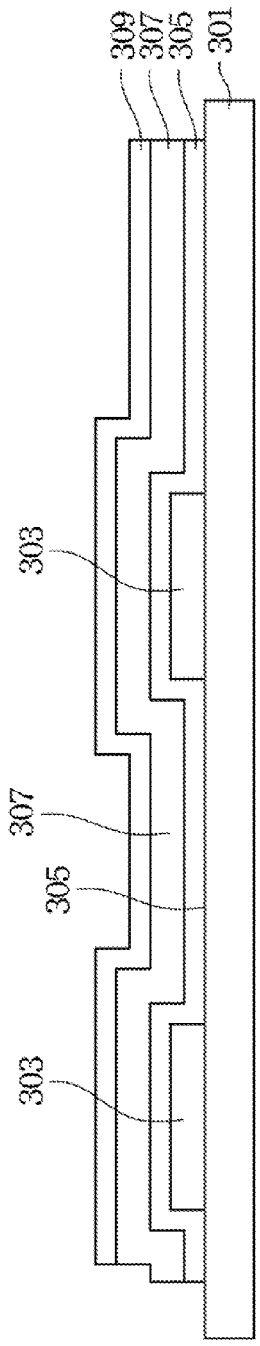
FIG. 3D, FIG. 3E, and FIG. 3F show cross-sectional views of the display panel circuit structure according to one embodiment of the present disclosure.
Figure 3E:
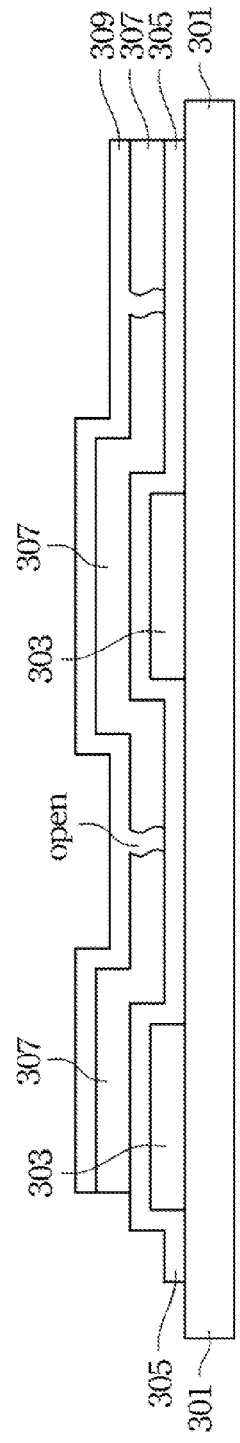
Figure 3F:
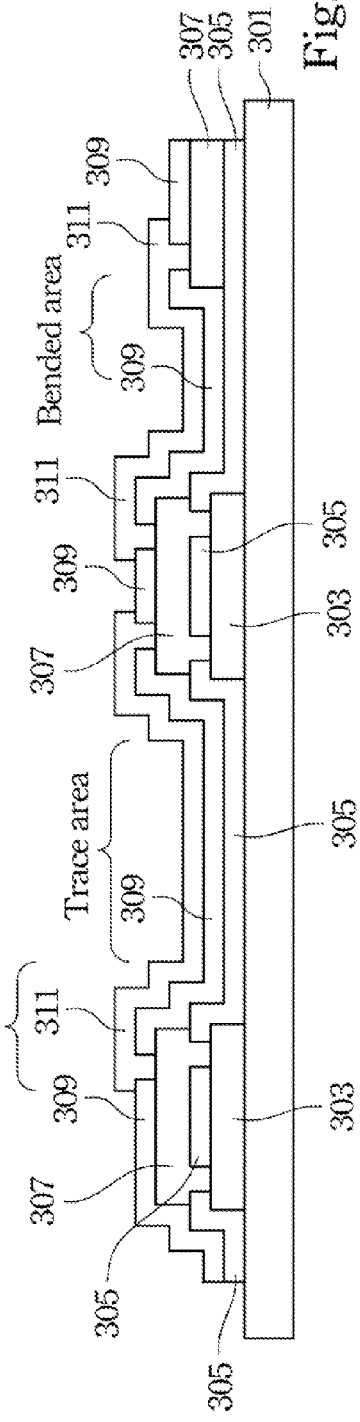

FIG. 3D, corresponding to FIG. 3A, shows the cross-sectional views derived from seeing through the line AA', in which situation the metal layers operate correctly and are not broken. FIG. 3E, corresponding to FIG. 3B, shows the cross-sectional view derived from seeing through the line BB', in which situation a certain metal layer is broken; FIG. 3F, corresponding to FIG. 3C, shows the cross-sectional view derived from seeing through the line CC', in which situation the broken metal layer has been repaired.

The display panel circuit structure substantially includes a substrate 301, a first metal layer 303, a second metal layer 307, and a third metal layer 311, in which the first metal layer 303 is disposed on substrate 301, the second metal layer 307 is disposed on the first metal layer 303, and the third metal layer 311 is disposed on the second metal layer 307. The second metal layer 307 has a pad area 317 and a trace area 319 connected to the pad area 317, and a line width of the second metal layer 307 in the pad area 317 is greater than a line width of the second metal layer 307 in the trace area 319.

The third metal layer 311 is floating and is not contact with or not electrically connected to other metal layers when the second metal layer 307 is able to conduct current (as shown in FIG. 3A). On the other hand, if the second metal layer 307 is broken and is in a situation unable to conduct current (shown in FIG. 3B, 3C, 3E, 3F), the second metal layer 307 in the pad area 317 is welded to and electrically connected to the third metal layer 311 in the pad area 317 such that the second metal layer 307 is able to conduct current through the third metal layer 311.

Specifically, the second metal layer 307 and the third metal layer 311 are physically connected together and electrically connected to each other through laser welding. Furthermore, if the second metal layer 307 is open and is in the situation unable to conduct current, the first metal layer 303, the second metal layer 307, and the third metal layer 311 are welded together in the pad area 317.

The second metal layer 307 further includes a bended area 321 connected to the trace area 319 for altering extended direction, and a line width of the bended area 321 is greater than a line width of the trace area 319. The bended area 321 of the second metal layer 307 is electrically connected to the third metal layer 311 through the welding point 315 when the second metal layer 307 is in a situation unable to conduct current. The pad area 317 and the bended area 321 can be disposed outside the display region and be disposed on the non-display region, in which case the third metal layer 311 and the second metal layer 307 are welded as well as conducted together outside the display region.

In addition to the metal layers recited above, the display panel circuit structure further includes a first insulating layer 305 and a second insulating layer 309. The first insulating layer 305 is disposed between the first metal layer 303 and the second metal layer 307 for partially separating the first metal layer 303 and the second metal layer 307. The second insulating layer 309 is disposed between the second metal layer 307 and the third metal layer 311 for partially separating the second metal layer 307 and the third metal layer 311.

According to the above embodiments, a third metal layer which is floating and does not effect when the circuit structure can correctly conduct current has been buried therein in advance for replacement, and a broken metal layer, particularly the broken gate metal layer can be replaced with the third metal layer for replacement when circuit failure occurs. Therefore, the metal layers as well as the circuit structure can operate correctly, the display can display correctly, product yield of the display can be improved, and costs for to manufacturing the display can be reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display panel circuit structure, comprising:
   a substrate;
   a first metal layer disposed on the substrate;
   second metal layer disposed on the first metal layer and electrically connected to the first metal layer, wherein the second metal layer has a first pad, a second pad and a trace portion interconnected between the first pad and the second pad, and line widths of the first pad and second pad are greater than a line width of the trace portion; and
   a third metal layer disposed on the second metal layer, wherein the third metal layer extends from a first position overlapped with the first pad to a second position overlapped with the second pad and the third metal layer is not overlapped with the trace portion of the second metal layer.

2. The display panel circuit structure as claimed in claim 1, wherein the third metal layer is electrically connected to the first pad and the second pad respectively at the first position and the second position when the second metal layer is in a situation unable to conduct current.

3. The display panel circuit structure as claimed in claim 2, wherein the first pad and the second pad are electrically connected to the third metal layer through laser welding.

4. The display panel circuit structure as claimed in claim 2, wherein the first metal layer, the second metal layer, and the third metal layer in the first pad and the second pad are connected together through welding when the second metal layer is in the situation unable to conduct current.

5. The display panel circuit structure as claimed in claim 1, wherein the second metal layer further comprises a bended area connected to the trace portion for altering extended direction, and a line width of the bended area is greater than the line width of the trace portion.

6. The display panel circuit structure as claimed in claim 1, further comprising:
- a first insulating layer disposed between the first metal layer and the second metal layer for partially separating the first metal layer and the second metal layer; and
- a second insulating layer disposed between the second metal layer and the third metal layer for partially separating the second metal layer and the third metal layer.

7. The display panel circuit structure as claimed in claim 1, wherein the first metal layer, the second metal layer, and the third metal layer are low-impedance conductive layers.

8. The display panel circuit structure as claimed in claim 1, wherein the third metal layer is floating when the second metal layer is in a situation able to conduct current.

9. The display panel circuit structure as claimed in claim 1, wherein the first metal layer is a gate layer of a transistor.

10. The display panel circuit structure as claimed in claim 1, wherein the first metal layer comprises a third portion and a fourth portion spaced apart from the third portion, the third portion and the fourth portion being connected to and overlapped with the first pad and the second pad respectively,
wherein when the second metal layer is in a situation unable to conduct current, the third portion is electrically connected to the fourth portion through third metal layer, and the first pad and the second pad are connected with the third metal layer through welding.

* * * * *